United States Patent [19]
Reynolds et al.

[11] Patent Number: 5,708,432
[45] Date of Patent: Jan. 13, 1998

[54] COHERENT SAMPLING DIGITIZER SYSTEM

[75] Inventors: David Dean Reynolds, Beaverton; Roman Aureli Slizynski, Aloha, both of Oreg.

[73] Assignee: Credence Systems Corporation, Fremont, Calif.

[21] Appl. No.: 684,466

[22] Filed: Jul. 19, 1996

[51] Int. Cl.$^6$ .................................................. H03M 1/00
[52] U.S. Cl. ............................................................ 341/123
[58] Field of Search ............................................ 341/123

[56] References Cited

U.S. PATENT DOCUMENTS 5,589,763  12/1996  Burns ................................. 324/76.15

OTHER PUBLICATIONS

Coleman, Brendan, Pat Meehan, John Reidy and Pat Weeks, "Coherent Sampling Helps When Specifying DSP A/D Converters," *EDN* Oct. 15, 1987, pp. 145–152.

Mielke, *Frequency Domain Testing of ADCs*, IEEE Design & Test of Computers, vo. 13, No. 1 pp. 64–69, Spring 1996.

*Primary Examiner*—Howard L. Williams
*Attorney, Agent, or Firm*—Smith-Hill and Bedell

[57] ABSTRACT

A digitizing system coherently samples an input signal of frequency $F_t$ and generates an output data sequence representing magnitudes of N successive samples. The digitizing system generates a timing signal by frequency dividing a clock signal of frequency $F_{MCLK}$ by an integer factor K and supplies the timing signal to a digitizer. The digitizer coherently samples the input signal N times over M cycles of input signal to produce an N-term data sequence representing one cycle of the input signal. The timing signal frequency sets the digitizer sampling rate. The digitizing system includes a computer programmed to execute an algorithm for finding an appropriate value for K so that the system substantially achieves coherent sampling of the input signal despite limitations in allowable ranges of K, M and N. The algorithm searches a Farey series to locate terms of the form P/Q from which it may derive candidate values of K ($K=Q_i*J$), M ($M=P*J$) and N ($N=Q_i$), wherein P and Q are relatively prime integers, J is an integer greater than 0 and $Q_i$ is an integer factor of Q. The algorithm locates the particular Farey series term most closely approximating the ratio $F_t/F_{MCLK}$ for which candidate values of K, M and N fall within their allowable ranges. The digitizing system then frequency divides the master clock signal by that candidate value of K.

12 Claims, 9 Drawing Sheets

COHERENT SAMPLING DIGITIZER SYSTEM

BACKGROUND OF THE INVENTION

1. Field of the Invention

The present invention relates in general to a digitizer system for periodically sampling an analog signal and digitizing each sample, and in particular to a digitizing system which automatically adjusts its sampling rate to provide coherent sampling.

2. Description of Related Art

A digitizer "digitizes" an analog signal by periodically sampling its magnitude and generating digital data indicating the magnitude of each sample. The digitizer thus produces a data sequence representing the time-varying behavior of the analog signal. Digital signal processing (DSP) software can analyze such a data sequence to provide information about the analog signal. For example a digital spectrum analyzer subjects the data sequence to discrete Fourier transform analysis to produce another data sequence representing the frequency spectrum of the analog input signal.

When the analog signal is periodic, the data sequence need only represent one cycle of the analog signal since data representing additional cycles would be redundant. But for accurate results, DSP analysis techniques require that the data sequence represent a minimum number $N_{MIN}$ of input signal samples. Otherwise the data sequence will not adequately reflect the behavior of high frequency components of the analog signal. Unfortunately, a digitizer cannot always operate fast enough to acquire $N_{MIN}$ samples during a single cycle of the analog signal. To overcome this problem the digitizer may employ "equivalent time sampling" wherein it samples the input signal at a slower rate over several cycles of the input signal. Since the input signal is periodic, the samples can be timed so that the resulting sequence is equivalent to a sequence that would have been produced by sampling one cycle of the input signal at a higher rate. For example if a digitizer samples ten successive cycles of an input signal at a sampling frequency $F_s$ 1.1 times the frequency $F_t$ of the input signal, the resulting data sequence would be identical to a data sequence obtained by sampling one cycle of the input signal at a rate 10 times that of the input signal.

For a given input signal frequency $F_t$ and a desired number N of samples, we would like to be able to adjust the sampling frequency $F_s$ and the number of analog signal cycles M over which the samples are taken to provide equivalent time sampling wherein the samples appear to have been taken at N evenly distributed times during one cycle of the analog signal. At pages 17–21 of the book "DSP-Based Testing of Analog and Mixed-Signal Circuits" by Matthew Mahoney, published in 1987 by the Computer Society Press of the IEEE, the author teaches that proper equivalent time sampling may be achieved by satisfying the following conditions for "coherent sampling":

$$F_t/F_s = M/N \quad (1)$$

and $$GCD(M,N) = 1 \quad (2)$$

Equation (2) says that the greatest common denominator of M and N is one. In other words, M and N are "relatively prime". If equations (1) and (2) are satisfied, we have what is known as "coherent sampling" wherein any N consecutive samples of a signal of frequency $F_t$ taken over M test signal cycles at frequency $F_s$ will look the same as N consecutive samples evenly distributed over 1 analog signal cycle.

However in practice it is often difficult or impossible to pick values of $F_s$, M and N satisfying equations (1) and (2) for a given value of $F_t$. Digitizing systems typically frequency divide a master clock signal to produce a timing signal for controlling the sampling rate. Thus the sampling frequency $F_s$ cannot be varied continuously over its full range; it can take on only a limited number of discrete values. To satisfy equation (1) $F_t$ and $F_s$ must have the same ratio as M and N. Since $F_s$ can have only a limited number of discrete values, we often cannot simply choose convenient values of M and N and then adjust $F_s$ to satisfy equation (1). There are also constraints on the values of M and N that make satisfying equation (1) difficult. If the number M of input signal cycles sampled is too large, the data acquisition process becomes too lengthy. If M is too small, the required sampling frequency may be too high for the digitizer. If the number N of samples taken is too small, the accuracy of the DSP analysis will suffer. If N is too large, the DSP computations may be too time consuming.

However when we choose values of $F_s$, M, and N wherein the ratio $F_t/F_s$ is very close, but not exactly equal, to the ratio M/N, any error in DSP analysis of the resulting data sequence is negligible. But finding values of M, N and $F_s$ for a given value of $F_t$ approximating the relation of equation (1) with a level of accuracy needed to avoid significant error in the DSP analysis of the digitizer output has been problematic.

What is needed is a sampling system which automatically and rapidly establishes its own sampling rate so as to provide coherent sampling of an input signal of known frequency.

SUMMARY OF THE INVENTION

A sampling system automatically adjusts its sampling rate to coherently sample a periodic analog signal such that a set of N consecutive samples taken over M cycles of the analog signal appear to have been taken at N evenly distributed intervals over a single cycle of the analog signal. The sampling system includes a clock circuit for generating a master clock signal of frequency $F_{MCLK}$, a timing signal generator for frequency dividing the clock signal by a factor K to produce a timing signal of frequency $F_{MCLK}/K$, and means for sampling the input signal at a rate controlled by the timing signal. In accordance with the invention, the sampling system also includes a computer for executing an algorithm for finding a suitable value for K for a given input signal frequency $F_t$. The algorithm finds a value for K providing coherent sampling while taking into account predetermined limitations on the ranges of K, M and N. The computer supplies that value of K to the timing signal generator.

Coherent sampling is attained when $F_t$ and $F_s = F_{MCLK}/K$ are relatively prime. The algorithm finds a suitable value for K by performing a directed search of a Farey series of order F, an ordered list of all fractions with denominators varying from 1 to F, each fraction having relatively prime numerator and denominator. In performing the directed search of the Farey series, the algorithm finds a term P/Q best approximating the ratio $F_t/F_s$ for which there exists a suitable combination of integer factor $Q_i$ of Q and integer value J such that $N = Q_i$ $M = P*J$ $K = Q*J/Q_i$ and such that N, M and K fall within their allowable ranges. The computer then supplies the computed value of K to the signal generator. The search uses techniques for quickly traversing the Farey so as to find a suitable Farey series term P/Q with minimal computation. When the range F of the Farey series searched is sufficiently large, the algorithm quickly returns a value for K for which the system coherently samples the analog signal with a high degree of accuracy.

It is therefore an object of the present invention to provide a sampling system which automatically and rapidly establishes its own sampling rate so as to provide coherent sampling of an analog input signal of known frequency.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
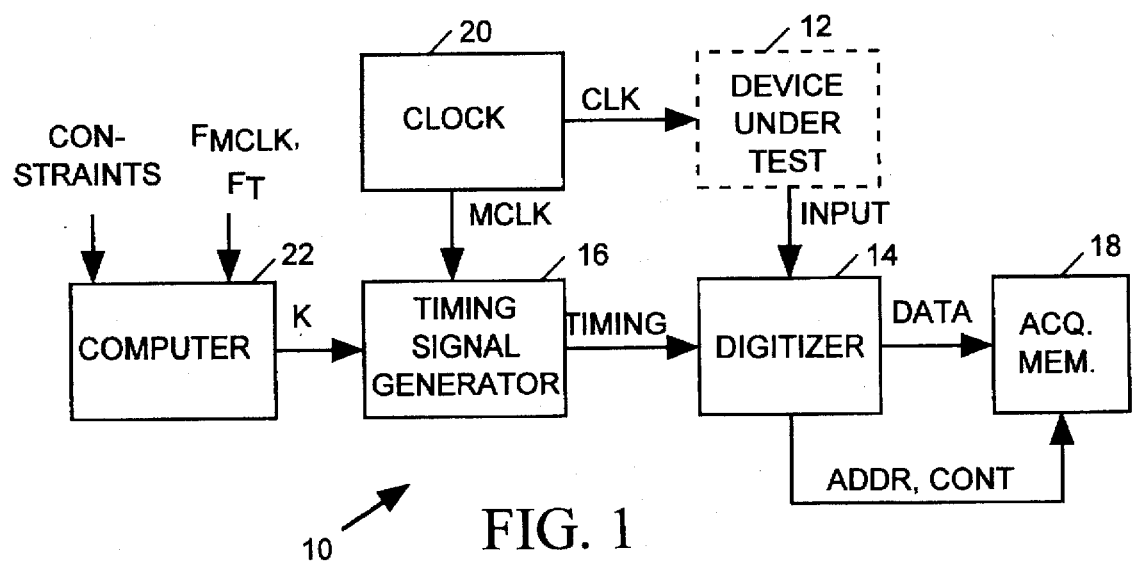
FIG. 1 illustrates in simplified block diagram form a digitizing system in accordance with the present invention.

FIG. 1 illustrates in simplified block diagram form a coherent sampling system 10 in accordance with the present invention. Sampling system 10 periodically samples the magnitude of a periodic analog input signal (INPUT) produced by a device under test 12 and generates a sequence of digital data values (DATA) representing magnitudes of successive INPUT signal samples. The DATA sequence may be analyzed using any of several well-known digital signal processing (DSP) techniques to obtain information about the INPUT signal. For example by subjecting the DATA sequence to discrete Fourier transform analysis, we can generate another data sequence representing the frequency spectrum of the INPUT signal.

Sampling system 10 includes a digitizer 14 for sampling the magnitude of the INPUT signal on each pulse of a periodic timing signal (TIMING) produced by a timing signal generator 16. Digitizer 14 generates a DATA value representing the magnitude of each INPUT signal sample and stores each generated DATA value in a random access acquisition memory 18. Digitizer 14 includes circuits for supplying address (ADDR) and control signals (CONT) to acquisition memory 18 so that successively generated DATA values are stored at successive addresses in acquisition memory 18. Timing signal generator 16 frequency divides an input master clock signal (MCLK) by an integer factor K to produce the TIMING signal. A conventional clock circuit 20 generates the master clock signal MCLK. A computer 22 (or other data processing means) computes a suitable value for K based on user-provided data indicating the frequency ($F_{MCLK}$) of the master clock signal MCLK, the frequency ($F_s$) of the INPUT signal, and various system constraints (CONSTRAINTS). Computer 22 supplies the computed value of K as an input to timing signal generator 16. Thus computer 22 sets the frequency $F_s$ of the TIMING signal by adjusting the value of K. Clock circuit 20 also derives clock signals CLK from the master clock signal MCLK and supplies them as input timing signals to device under test 12.

DSP techniques for analyzing periodic signals typically require as input a data sequence representing a number of evenly distributed samples of a single cycle of the input signal. For a high frequency INPUT signal, digitizer 14 may not be able to sample the INPUT signal fast enough to acquire and digitize an adequate number of samples during a single cycle of the INPUT signal. To overcome this problem sampling system 10 employs "equivalent time sampling" wherein digitizer 14 samples the INPUT signal at a relatively slow sampling rate ($F_s$) over several cycles of the INPUT signal. Since the INPUT signal is periodic, computer 22 adjusts the sampling rate (by adjusting K) so that the resulting DATA sequence is equivalent to a sequence that would have been produced by sampling one cycle of the INPUT signal at a higher rate.

Figure 2:
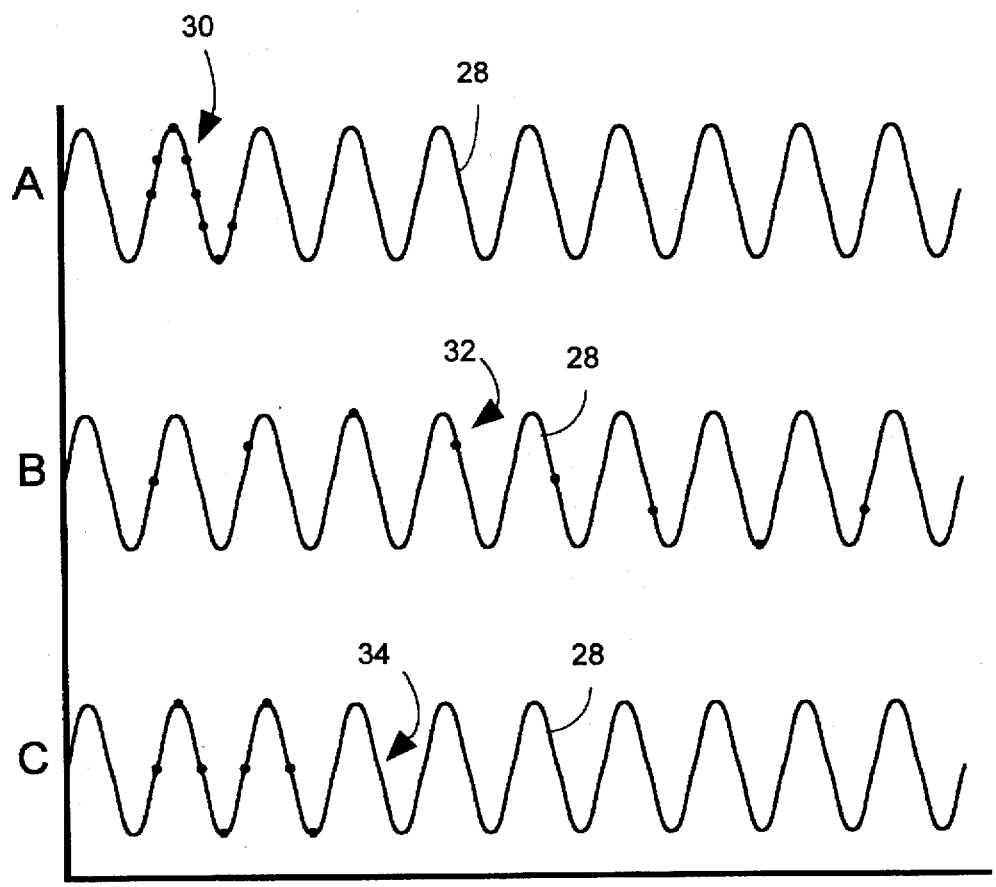
FIG. 2 illustrates digitizing an analog signal at various rates.

FIG. 2 illustrates results of sampling the INPUT signal at various sampling rates. Graph A represents the time varying magnitude of an INPUT signal 28 sampled 8 times at a frequency 8 times that of INPUT signal. Note that the 8 samples 30 are evenly distributed in time during one cycle of the INPUT signal. Graph B represents equivalent time sampling of the same INPUT signal 28 with a sampling frequency 1.125 times that of the INPUT signal. Note that while the equivalent time sampling of Graph B takes 8 times longer to acquire 8 samples 32 of the INPUT signal than the higher speed sampling of graph A, the two sampling rates result in identical output data sequences. Thus sampling at a rate of 1.125 times the INPUT signal frequency is equivalent to sampling at a rate 8 times the INPUT signal frequency with respect to the data sequence produced. Graph C illustrates results of sampling the INPUT signal 28 eight times at a rate that is 4 times that of the INPUT signal frequency. Note that due to the relationship between the sampling rate and the INPUT signal frequency, the last four samples in Graph C duplicate the first four samples. Thus even though the sampling rate in Graph C is higher than that of Graph B, the eight samples 34 in Graph C do not convey as much information about the INPUT signal as the eight samples obtained at the lower rate shown in Graph B.

Thus when employing equivalent time sampling, it is important to carefully adjust the sampling frequency in relation to the INPUT signal frequency. In particular, for a given INPUT signal frequency $F_t$ and a desired number of samples N, computer 22 adjusts the sampling frequency $F_s$ and the number of input signal cycles M over which the samples are taken to provide equivalent time sampling wherein the samples appear to have been taken at N evenly distributed times during one cycle of the input signal.

It has long been known to those skilled in the art that equivalent time sampling is assured by satisfying the following conditions:

$$F_t/F_s = M/N \quad (1)$$

and $$GCD(M,N) = 1 \quad (2)$$

Condition (2) says that the greatest common denominator (GCD) of M and N is one. In other words, M and N are "relatively prime", having no common integer factors. If conditions (1) and (2) are satisfied, we have what is known as "coherent sampling" wherein any N consecutive samples of a signal of frequency $F_t$ taken over M test signal cycles at frequency $F_s$ will have the same data content as N consecutive samples evenly distributed over one test signal cycle, though samples may occur in a different order.

Unfortunately, since there are practical constraints on the values of $F_s$, M and N, it is often impossible to satisfy conditions (1) and (2) for a given value of $F_t$. Timing signal generator 16 produces the TIMING signal by frequency dividing the master clock signal MCLK by an integer number K. Thus the TIMING signal frequency ($F_s=F_{MCLK}/K$) cannot be varied continuously over its full range; it can take on only a limited number of discrete values. To satisfy condition (1) $F_t$ and $F_s$ must have the same ratio as M and N. Since $F_s$ can have only a limited number of discrete values, we may not be able to simply choose convenient values of M and N and then adjust $K=F_{MCLK}/F_s$ to satisfy condition (1). Also constraints on the capabilities of timing signal generator 16 and/or digitizer 14 may limit the range of sampling frequency $F_s$. Also for a given ratio $F_t/F_s$, constraints on the values of M and N may make it impossible to satisfy condition (1). If the number M of input signal cycles sampled is too large, the data acquisition process becomes too lengthy or the required sampling rate may be below the lower frequency limit of the timing signal generator. If M is too small, the required sampling frequency may be too high for the digitizer or the timing signal generator. If the number N of samples taken is too small, the accuracy of the DSP analysis will suffer. If N is too large, the DSP computations may be too time consuming or the sample data sequence may exceed the storage capacity of the acquisition memory.

Thus in practice, for a given input signal frequency $F_t$, we often must settle for values of $F_s$, M, and N for which the ratio $F_t/F_s$ is close, but not exactly equal, to the ratio M/N as required by condition (1). As long as the error in satisfying condition (1) is very small, DSP analysis of the resulting sample data will provide reasonably accurate results. In accordance with the present invention, computer 22 executes an algorithm for finding a suitable value of K satisfying condition (2) and closely approximating condition (1) for a given master clock frequency $F_{MCLK}$ and a given INPUT signal frequency $F_t$. The algorithm also satisfies various constraints on the ranges of K (or $F_s$), M and N.

Solving condition (1) for M/N*K we can restate condition (1) as condition (1'):

$$M/(N*K) = F_t/F_{MCLK} \quad (1')$$

Since the test signal frequency $F_t$ and the master clock frequency $F_{MCLK}$ are given, then a target value for M/(N*K) is fixed:

$$TARGET = F_t/F_{MCLK}.$$

The algorithm executed by computer 22 of FIG. 1 finds values for M, N and K for which M/(N*K) best approximate the target value $F_t/F_{MCLK}$ of condition (1') with the constraints that M and N are relatively prime and M, N and K are restricted to predetermined ranges.

The algorithm for generating K makes a rational approximation of target by selecting the most appropriate term of a "Farey" series. A Farey series of order F is a list of all fractions P/Q reduced to lowest form (i.e. P and Q are relatively prime) with Q ranging from 1 to F. Such a series is infinite in size. Below is a portion of the Farey series of order F=8 ranging in value from 0 to 1:

0/1, 1/8, 1/7, 1/6, 1/5, 1/4, 2/7, 1/3, 3/8, 2/5, 3/7, 1/2, 4/7, 3/5, 5/8, 2/3, 5/7, 3/4, 4/5, 5/6, 6/7, 7/8, 1,1

In 1802 the mathematician Haros suggested using a Farey series as an aid to rational approximation of an irrational number. For example we can approximate a number such as pi (3.14159 . . . ), by simply scanning down a Farey series computing the decimal equivalent of each term until we find the fraction (1/7=0.142857 . . . ) most closely approximating the fractional portion of pi, and then add the integer portion (3) of pi to the selected fraction to obtain the approximation. Thus we have:

$$PI = 3.14159 \ldots \sim 3 + 1/7 = 22/7.$$

We can often improve the accuracy of the approximation by increasing the order of the Farey series so that we have more fractions from which to choose. However, computing and comparing successive terms of a large Farey series to a target value to find a best fit to the target value is time-consuming. In accordance with the invention, computer 22 therefore employs an efficient algorithm for the most appropriate Farey series term to approximate a given target number. The algorithm makes use of a relationship (discovered by Farey) between three successive terms ($P_L/Q_L$, $P_M/Q_M$, $P_R/Q_R$) of a Farey series of order $Q_M$:

$$P_M/Q_M = (P_L + P_R)/(Q_L + Q_R) = P_M/QM \quad (3)$$

The term $P_M/Q_M$ is referred to as the "mediant" of terms $P_L/Q_L$ and $P_R/Q_R$ to the immediate left and right of the mediant.

Figure 3:
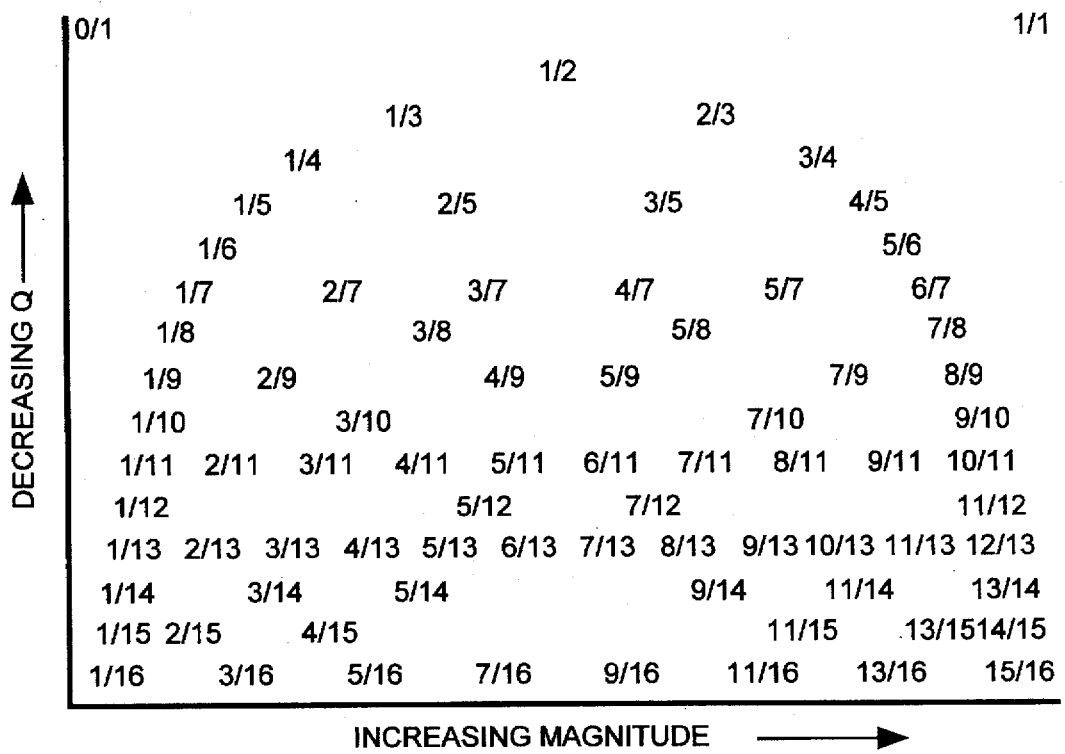
FIG. 3 is a two dimensional Brocot space diagram of a Farey series of order 16.

FIG. 3 is a two dimensional "Brocot space" diagram of a Farey series of order 16. Successive Farey series fractions of the form P/Q are arrayed along the horizontal axis in order of increasing magnitude while the fractions are arrayed along the vertical axis in order of decreasing denominator Q. We would like to find the fraction within this Brocot space which most closely approximates a given target value between 0 and 1. One way to efficiently do this is to perform "mediant traverse" search.

Figure 4:
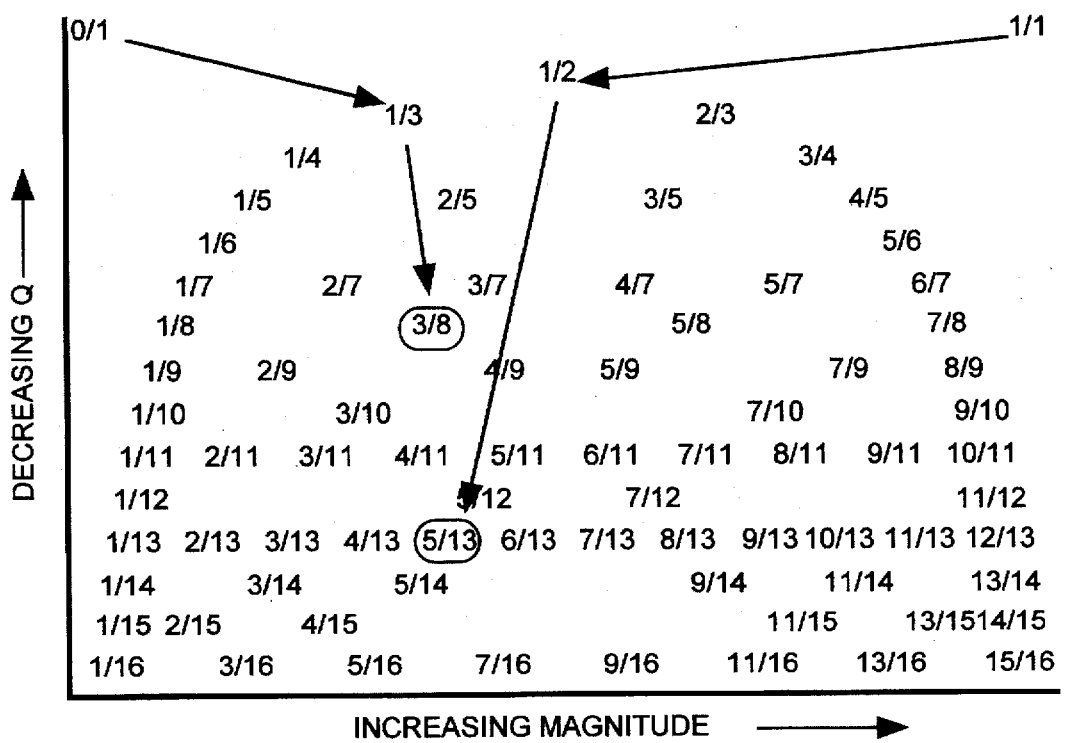
FIG. 4 illustrates a mediant traverse search of the Brocot space of FIG. 3.

FIG. 4 illustrates a mediant traverse search of the Brocot space of FIG. 3. Referring to FIG. 4, we quickly locate the particular fraction P/Q in a Brocot space of order 16 between 0/1 and 1/1 which most closely approximates a target value 0.381. We initially choose the fractions 0/1 and 1/1 as left and right bounds $P_L/Q_L$ and $P_R/Q_R$ between which we know lies the target 0.381. We then use relation (3) to find a mediant $P_M/Q_M$ (½) between the two bounds in Brocot space of order M=L+R. We then compare the mediant ½ to the target 0.381 and see that the target is less than the mediant. We know now that the best approximation of the target is bounded by two Farey numbers 0/1 and ½.

We now replace the right bound $P_R/Q_R$=1/1 with the mediant ½ and employ relation (3) once more to compute a new mediant $P_M/Q_M$ (in Brocot space of order M=L+R=3) between right and left bounds 0/1 and ½. The new mediant is ⅓. Since ⅓ is less than the target (0.381), we replace the lower bound ($P_R/Q_R$=0/1) with mediant ⅓ and use relation (3) to locate a new mediant (⅜) between left and right bounds ⅓ and ½. Since target 0.381 exceeds ⅜, we replace left bound $P_L/Q_L$=⅓ with ⅜ and invoke relation (3) once more to find a new mediant $P_M/Q_M$=5/13 between ⅜ and ½.

We now determine that the target 0.0381 lies between left and right bounds ⅜ and 5/13 and again use relation (3) to find a mediant (8/12) between left and right bounds ⅜ and 5/13. However, since the new mediant, 8/21, is not in the Brocot space of order 16 to which our solution is limited, we can go no further. Thus the search has led us to two bounds ⅜ and 5/13 between which lies no intermediate fraction in our Brocot space of order 16. It remains only to determine which of fractions ⅜ and 5/13 most closely approximates the target. Since 5/13 (~0.385) is closer to target 0.381 than ⅜ (0.25) we select 5/13 as our best approximation of the target. The approximation error is about 0.004. Note that of the 79 fractions between 0/1 and 1/1 in the F=16 Brocot space of FIG. 4, the mediant traverse search method required us to compute and compare only 4 such fractions to the target. Thus the above-described mediant traverse is a computationally efficient method for finding the best fractional approximation of a target value within a given Brocot space. We can reduce the approximation error to about 0.000047 by increasing the allowable order of the Brocot space from 16 to at least 21. This permits us to choose the last computed mediant 8/21 (~0.38095) as the best approximation of target 0.381.

Figure 5:
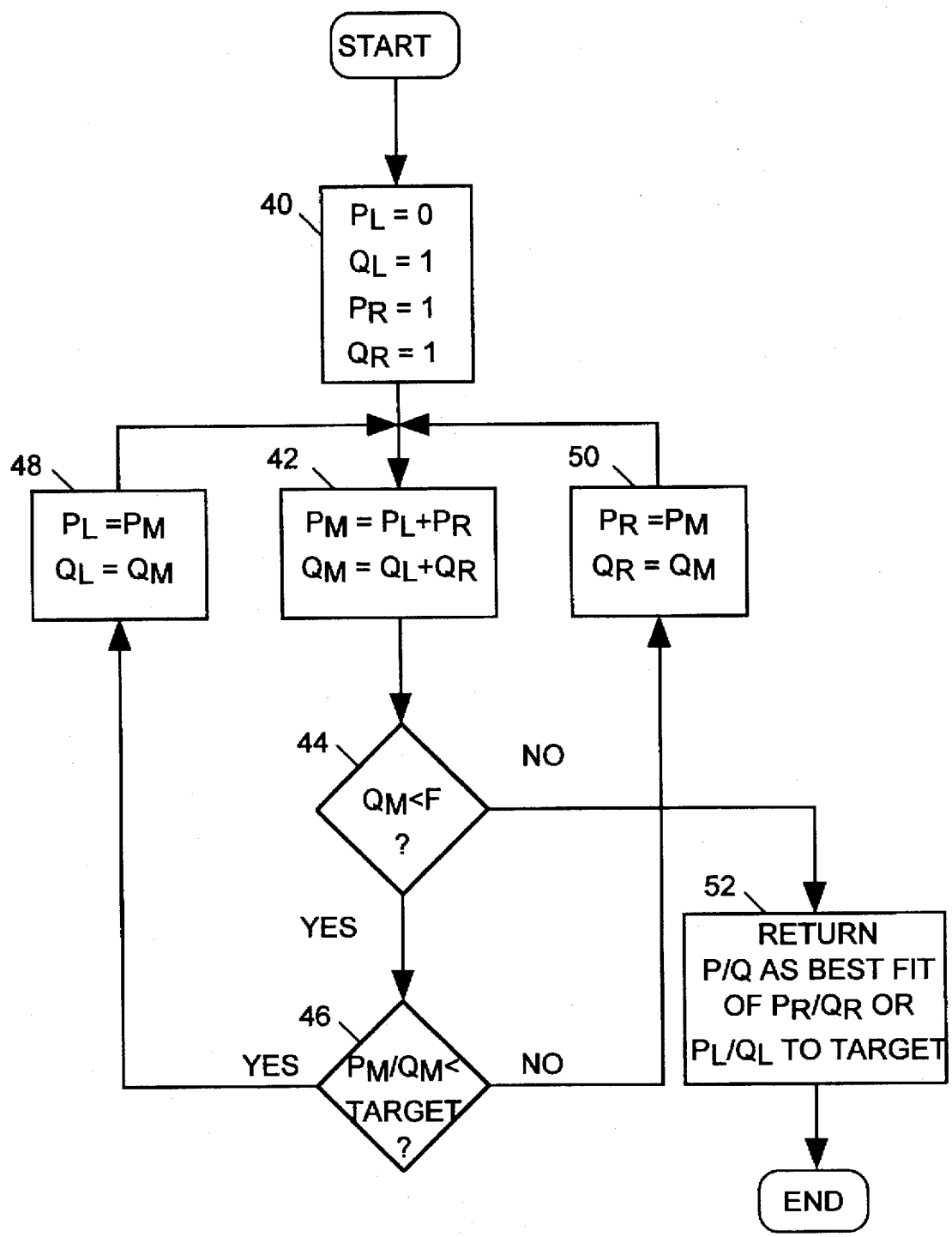
FIG. 5 is a flow chart for programming a computer to carry out a mediant traverse of Brocot space of order F to find a Farey series number most closely approximating a given target value between 0 and 1.

FIG. 5 is a flow chart for programming a computer to carry out a mediant traverse of Brocot space of order F to find the Farey series number P/Q most closely approximating a given target number (TARGET) between 0 and 1. Starting at step 40, we initialize our upper and lower bounds $P_L/Q_L$ and $P_R/Q_R$ to 0/1 and 1/1 by setting $P_L$ equal to 0 and setting $Q_L$, $P_R$ and $Q_R$ equal to 1. We then compute $P_M$ and $Q_M$ (step 42) for the mediant $P_M/Q_M$ in accordance with equation (3) above. If $Q_M$ is less than the order F of the Brocot space being searched (step 44) we compare the mediant $P_M/Q_M$ to the TARGET (step 46). If the mediant $P_M/Q_M$ is less than TARGET we replace left bound $P_L/Q_L$ with the mediant $P_M/Q_M$ (step 48) and return to step 42. If at step 46 the mediant is greater than or equal to TARGET, we replace right bound $P_R/Q_R$ with mediant $P_M/Q_M$ (step 50) and return to step 42. We continue to iterate through steps 42–50 until at step 44, $Q_M$ exceeds F. At this point the Farey series numbers $P_L/Q_L$ and $P_R/Q_L$ for last computed values of $P_L$, $Q_L$, $P_R$, and $Q_L$ are the nearest left and right bounds to the TARGET fraction within Brocot space of order F. Having determined the two Farey series numbers $P_L/Q_L$ and $P_R/Q_R$ most closely approximating TARGET, the routine (step 52) compares $P_L/Q_L$ and $P_R/Q_R$ to TARGET to determine which of the two bounding fractions is the best approximation of the TARGET and returns that fraction as P/Q.

We have shown in FIG. 5 a mediant traversal method for finding the two fractions $P_L/Q_L$ and $P_R/Q_R$ best approximating P/Q of a TARGET value between 0 and 1 where P and Q are constrained to being relatively prime integers and Q is constrained to being not greater than F. Let us suppose now that we have additional constraints on the values of P and/or Q so that neither of the two boundaries $P_L/Q_L$ and $P_R/Q_R$ of the TARGET found by the mediant traversal algorithm of FIG. 5 necessarily satisfies those additional constraints. Suppose in the example of FIG. 4, we had an additional constraint that the value of Q in a fraction P/Q selected to approximate the TARGET should exceed 13. In that case neither of the right and left bounds ⅜ and 5/13 produced by the mediant traversal search satisfy the additional constraint. We cannot therefore choose either the right or left bound as our best approximation of the TARGET.

If neither the left bound $P_L/Q_L$ nor the right bound $P_R/Q_R$ produced by the algorithm of FIG. 5 satisfy the additional constraint, the next two best approximations of the TARGET value within Brocot space of order F will be the next smaller Farey number to the immediate left of the left boundary $P_L/Q_L$ and the next larger Farey number to immediate right of the right boundary $P_R/Q_R$. Therefore having executed the algorithm of FIG. 5 to discover two fractions $P_L/Q_L$ and $P_R/Q_R$ that are two successive terms $P_{i-1}/Q_{i-1}$ and $P_i/Q_i$ of the Farey series of order F which bound the target. We would like to then look at the next preceding and next succeeding terms $P_{i-2}/Q_{i-2}$ and $P_{i+1}/Q_{i+1}$ of the series to determine whether either of those terms satisfy the additional constraints. Relations (4a)–(4f) below (discovered by Farey) allows us to quickly determine next higher and lower terms $P_{i+1}/Q_{i+1}$ and $P_{i-2}/Q_{i-2}$ of a Farey series of order F knowing only its two successive terms ($P_{i-1}/Q_{i-1}$, $P_i/Q_i$):

$$K_1 = \text{FLOOR}[(Q_{i-1}+F)/Q_i] \quad (4a)$$

$$P_{i+1} = (K_1 * P_{i-1}) - P_i \quad (4b)$$

$$Q_{i+1} = (K_1 * Q_{i-1}) - Q_i \quad (4c)$$

$$K_2 = \text{FLOOR}[(Q_i+F)/Q_{i-1}] \quad (4d)$$

$$P_{i-2} = (K_2 * P_i) - P_{i-1} \quad (4e)$$

$$Q_{i-2} = (K_2 * Q_i) - Q_{i-1} \quad (4f)$$

The FLOOR[x] function returns the largest integer not greater than x.

Returning to the example of FIG. 4, recall that we were interested in finding the best approximation to a TARGET value of 0.381. Executing the algorithm of FIG. 5 we performed a mediant traverse of Brocot space of order F=16 to find left and right bounds ⅜ and 5/13 and we determined that the Farey number 5/13 was the best fit. Suppose now that we have an additional constraint that Q must be in the range Q>13. In such case we see that neither the upper bound 5/13 nor the lower bound ⅜ satisfies the additional constraint. Therefore we may use relations 4 to horizontally traverse the Farey series to the left of ⅜ and to the right of 5/13 to look at the next larger and next smaller Farey series numbers to find a term which best approximates the target value 0.381 while satisfying the additional constraint Q>13.

Figure 6:
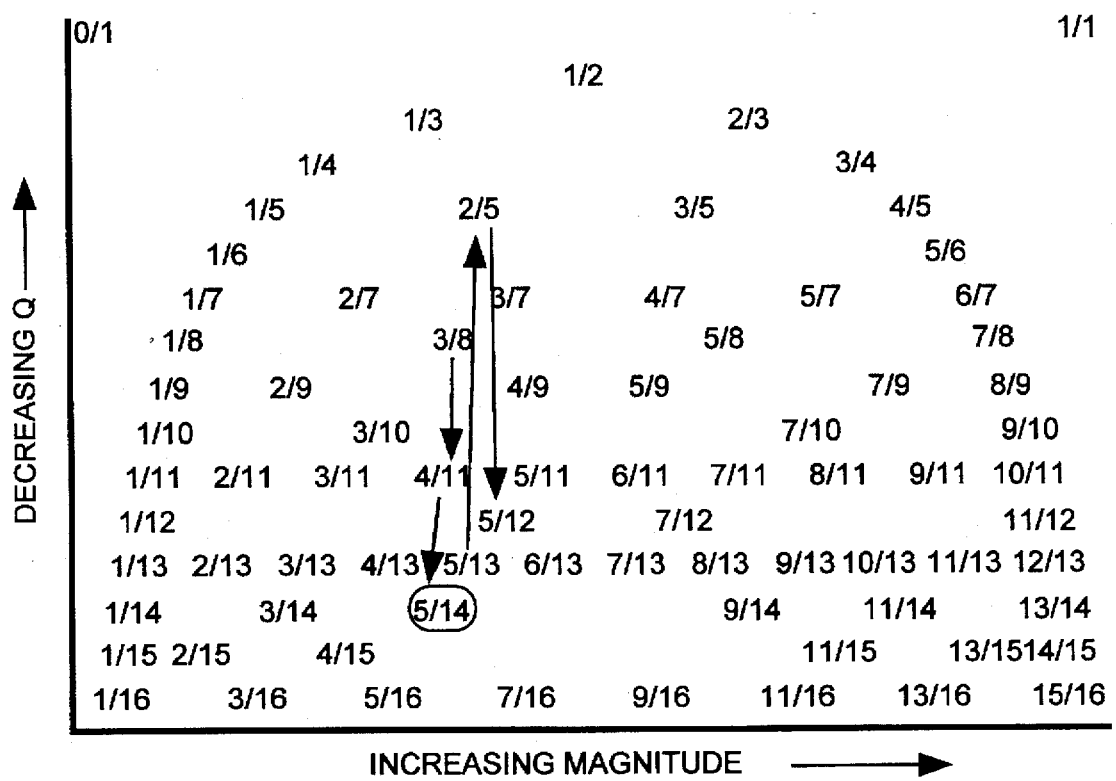
FIG. 6 illustrates left and right horizontal traverses of the Brocot space of FIG. 5.

FIG. 6 illustrates left and right horizontal traverses of the Brocot space of FIG. 5. Using ⅜ as $P_{i-1}/Q_{i-1}$ and 5/13 as $P_i/Q_i$ in relations (4), we compute the first term to the right of 5/13 as ⅖ and compute the first term to the left of ⅜ as 4/11. Since neither of these terms (4/11 or 5/13) satisfies the constraint Q>13, we continue to horizontally traverse the Farey series to the left and right. Using 5/13 as $P_{i-1}/Q_{i-1}$ and ⅖ as $P_i/Q_i$ in relations (4), we find the next term to the right of ⅖ is 5/12. Here again we find the new term 5/12 does not satisfy the constraint Q>13. However using 3/8 as $P_{i-1}/Q_{i-1}$ and 4/11 as $P_i/Q_i$ in relations (4), we find the next term to the left of 4/11 is 5/14, which does satisfy the constraint Q>13. Thus we have located the order 16 Farey series term (5/14) having a denominator Q satisfying the constraint Q>13 which most closely approximates the TARGET 0.381.

Due to the limited order of the Brocot space searched, and due to the additional constraint on Q, the result 5/14 (~0.357) is not a particularly good approximation of the TARGET (0.381). However, the accuracy of the result increases with the square of Brocot space order F. Since the amount of computation required increases only linearly with Brocot space order, by increasing Brocot space order we can dramatically increase the accuracy of the approximation with only a modest increase in computation.

Figure 7A:
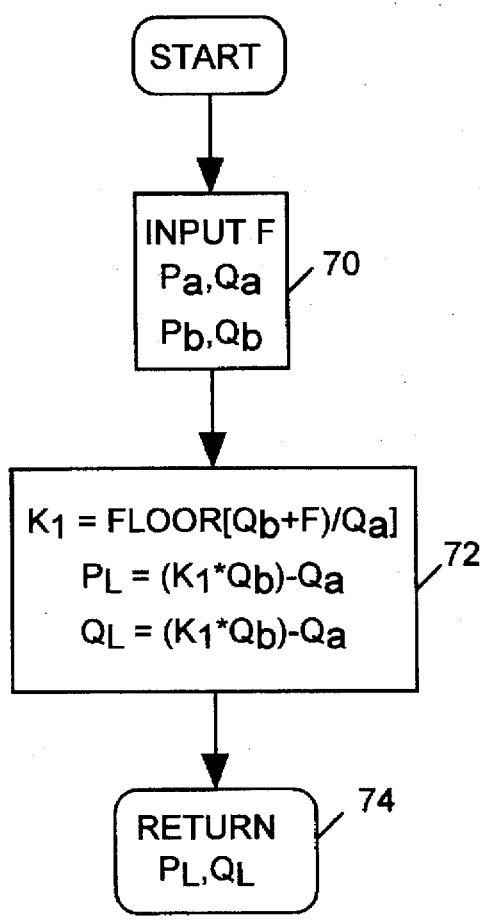
FIGS. 7A and 7B are flow charts depicting software routines for performing left and right horizontal traverses, respectively.
Figure 7B:
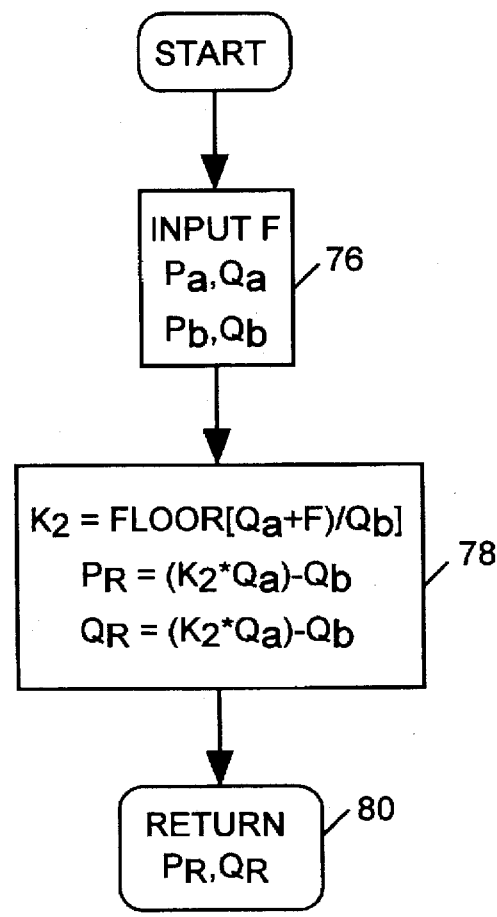

FIGS. 7A and 7B are flow charts depicting software routines for performing left and right horizontal traverses to locate Farey series numbers $P_L/Q_L$ and $P_R/Q_R$ immediately to the left and right of two adjacent numbers $(Q_a/P_a, Q_b/P_b)$ of a Farey series of order F, where $Q_a/P_a < Q_b/P_b$. Referring to FIG. 7A, starting at step 70 the routine receives input values $Q_a$, $P_a$, $Q_b$, $P_b$, and F. At step 72 the routine employs relations (4a)–(4c) above to compute $P_L$ and $Q_L$ for the next smaller Farey series term $P_L/Q_L$. The results, $P_L$ and $Q_L$, are returned at step 74. Referring to FIG. 7B, starting at step 76, the routine acquires input values $Q_a$, $P_a$, $Q_b$, $P_b$, and F. At step 78 the routine employs relations (4d)–(4f) above to compute values $P_R$ and $Q_R$ for the next larger Farey series term $P_R/Q_R$. The results $P_R$ and $Q_R$ are returned at step 80.

Figure 8:
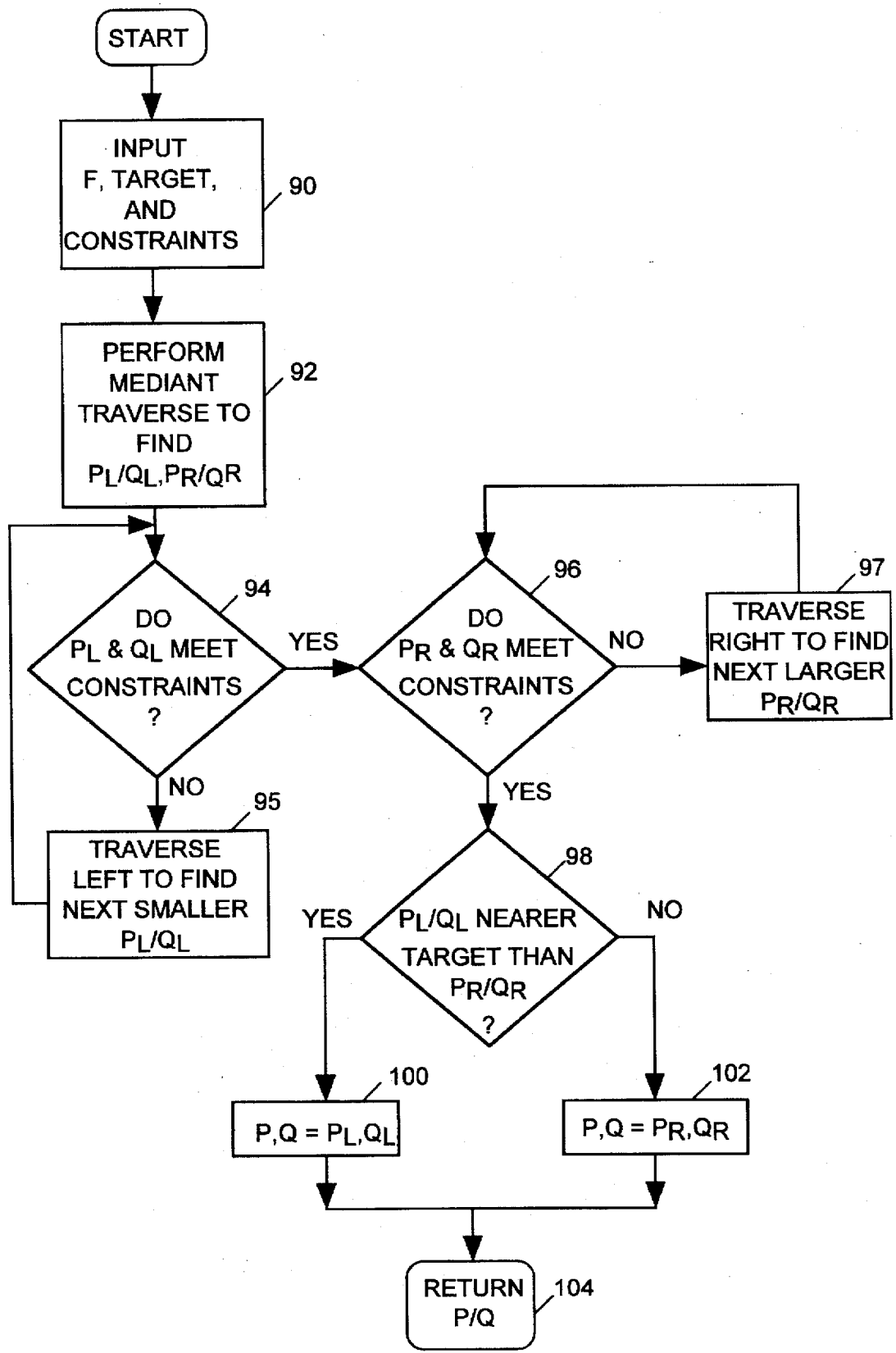
FIG. 8 is a flow chart for programming a computer to execute an algorithm for locating a Farey series term best fitting a target value and while satisfying additional constraints.

FIG. 8 is a flow chart for programming a computer to execute an algorithm for locating the fraction P/Q within a Farey series of order F from 0 to 1 where P/Q best fits a TARGET value and also satisfies various additional constraints on the values of P and Q. Starting at step 90 the algorithm receives the TARGET value and F as inputs. It also receives data indicating the constraints on P and Q. At step 92, the algorithm performs a mediant traverse of Brocot space of order F. The mediant traverse, similar to that illustrated in FIG. 5, returns values of the two Farey series numbers $P_L/Q_L$ and $P_R/Q_R$ to the immediate left and right of the TARGET. At step 94 the algorithm tests whether $P_L$ and $Q_L$ meet the constraints on P and Q. If not, then (step 95) the algorithm traverses the Farey series one number to the left choosing the next smaller Farey number as $P_L/Q_L$. The algorithm continues to cycle through steps 94 and 95 traversing progressively to the left until it finds the largest Farey number $P_L/Q_L$ smaller than the TARGET which meets the constraints on P and Q at step 94. At that point (step 96) the algorithm tests whether $P_R$ and $Q_R$ meet the constraints on P and Q. If not, then the algorithm traverses the Farey series one number to the right choosing the next larger Farey number as $P_R/Q_R$ (step 97). The algorithm continues to cycle through steps 96 and 97 traversing progressively to the right until it finds the smallest Farey number $P_L/Q_L$ larger than the TARGET meeting the constraints on P and Q at step 96.

After finding left and right boundaries $P_L/Q_L$ and $P_R/Q_R$ meeting the constraints on P and Q, the algorithm determines whether $P_L/Q_L$ is closer to the TARGET than $P_R/Q_R$ (step 98). If $P_L/Q_L$ is closer to TARGET P and Q are set equal to $P_L$ and $Q_L$ (step 100). Otherwise P and Q are set equal to $P_R$ and $Q_R$ (step 102). After step 100 or 102, the algorithm returns P/Q (step 104) and ends.

Returning to FIG. 1, recall that the task assigned to computer 22 is to find a suitable value for K, the input to timing signal generator 16. Recall also that K is the integer factor by which timing signal generator 16 divides the master clock signal frequency $F_{MCLK}$ to establish the frequency $F_s$ of the TIMING signal controlling digitizer 16 sampling. With M the number of cycles of the INPUT signal over which sampling is performed and N the number of samples to be taken, to provide for coherent sampling, computer 22 must find values for M, N and K such that the fraction M/N*K approximates $F_s/F_{MCLK}$ so that we can most nearly satisfy relation (1') above, given the following constraints:

$$GCD(M,N)=1 \quad (5)$$

$$N_{MIN} < N < N_{MAX} \quad (6)$$

$$M_{MIN} < M < M_{MAX} \quad (7)$$

$$K_{MIN} < K < K_{MAX} \quad (8)$$

When M/N*K approximates $F_s/F_{MCLK}$ with sufficient accuracy and constraint (5) (a restatement of relation (2) above) is satisfied, sampling system 10 provides an output data sequence closely resembling the result of coherent sampling of the INPUT signal. Additional constraints (6)–(8) a user may place on the ranges of N, M and K reflect limitations of the sampling system hardware or requirements of the DSP algorithms analyzing the DATA sequence produced by digitizer 14.

For convenience, we repeat relation (1') above:

$$M/(N*K)=F_s/F_{MCLK} \quad (1')$$

Dividing the top and bottom of the left-hand side of equation (1') by an integer J:

$$(M/J)/[N*(K/J)]=F_s/F_{MCLK} \quad (9)$$

Letting $$P=M/J \quad (10)$$

$$Q=N*(K/J) \quad (11)$$

$$TARGET=F_s/F_{MCLK} \quad (12)$$

and substituting equations (10)–(12) into equation (9) we have:

$$P/Q=TARGET \quad (13)$$

For coherent sampling, we want M, N and J to be relatively prime and we want K to be an integer within the frequency dividing range of timing signal generator 18 of FIG. 1. By restricting P/Q to being a number within a Farey series of order F, we ensure that P and Q will be relatively prime. If we also restrict N and J to be relatively prime integers, then M and N will be relatively prime. We also may want to restrict P and Q so that M, N and K are within allowable ranges.

Although it may be that no number P/Q in the Farey series of order F exactly satisfies equation (13), if the Farey series order is large enough, at least one number P/Q in the series will approximate TARGET with sufficient accuracy to provide for coherent sampling within the tolerance of any DSP application using the DATA output of digitizer 14 of FIG. 1.

Figure 9:
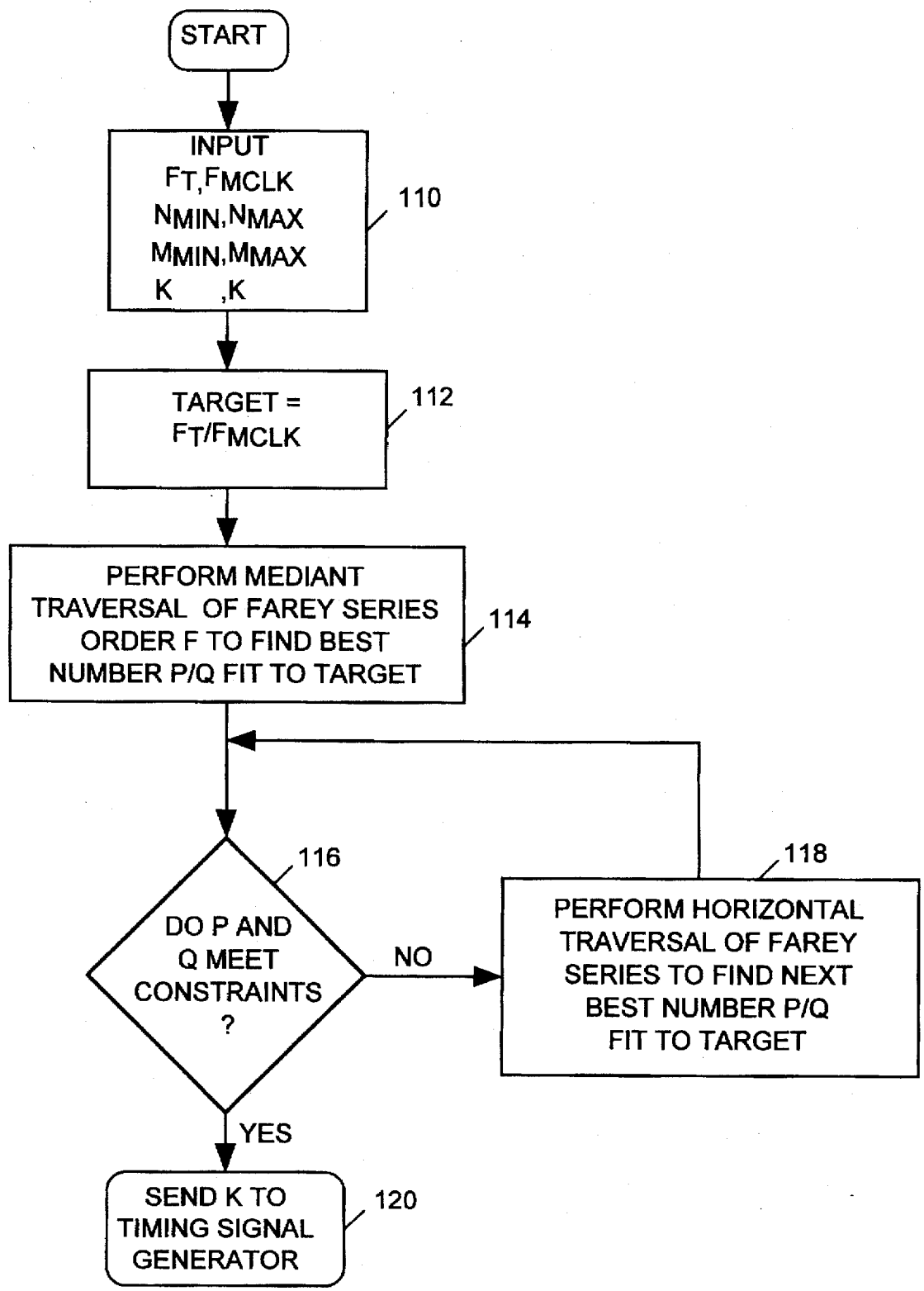
FIG. 9 is a flow chart of an algorithm to be executed by the computer of FIG. 1.

FIG. 9 is an algorithm executed by computer 22 of FIG. 1 for finding a suitable value of K for given minimum and maximum values of M,N and K and given INPUT and MCLK signal frequencies ($F_s$ and $F_{MCLK}$). The algorithm first computes a TARGET value using equation (12) above and then performs a directed search of a Farey series of order F to find a fraction P/Q satisfying the constraints on the ranges of M, N and K which most closely approximates the TARGET value.

Beginning at step 110 a user inputs $F_t$, $F_{MCLK}$, $N_{MAX}$, $N_{MIN}$, $M_{MAX}$, $M_{MIN}$, $K_{MAX}$ and $K_{MIN}$. The computer then computes the values of F and TARGET (step 112). The value of TARGET is computed in accordance with equation (12) above. The value of F (the order of the Farey series to be searched) is computed as the maximum allowable size of Q in equation (11) above. Since J in equation (11) is an arbitrary integer greater than 0, to maximize Q the algorithm minimizes J, setting it equal to 1. The algorithm also maximizes N and K. Thus at step 112 the algorithm computes the order F of the Farey series to be searched as:

$$F=N_{MAX}*(K_{MAX}/1).$$

Computer 22 then searches the Farey series of order F to locate the fraction P/Q best approximating the value of TARGET (step 114). Since P and Q are related to M, N, K, and J per equations (10) and (11) above, the constraints on M, N and K supplied at step 110 impose constraints on values of P and Q. Thus the computer next determines (as described in detail below) whether the selected values of P and Q meet constraints imposed on them (step 116). To be a valid approximation of the TARGET value a fraction P/Q must satisfy the following constraints:

1) For some integer value of J greater than 0, P=M/J and Q=N*(K/J),
2) N must lie between $N_{MIN}$ and $N_{MAX}$,
3) M must lie between $M_{MIN}$ and $M_{MAX}$,
4) K must lie between $K_{MIN}$ and $K_{MAX}$, and
5) J and N must be relatively prime.

If the values of P and Q do not satisfy their constraints, then the algorithm horizontally traverses the Farey series to find and select a next larger or smaller Farey series number providing a next best fit to TARGET (step 118). Using this next Farey series number as a new choice for P/Q, the algorithm returns to step 116 and determines whether the new P and Q values satisfy their constraints. The algorithm continues to cycle through steps 116 and 118 testing Farey series numbers ever further in value from TARGET until it determines at step 116 that it has found the best fitting Farey series number P/Q satisfying the constraints on P and Q.

In testing a selected P/Q number at step 116, computer 22 searches for values of M, N, K and J satisfying relations (10) and (11) above and also satisfying the input minimum/maximum criteria supplied at step 110. After finding a suitable Farey series number P/Q at step 116, the algorithm returns (at step 120) the value of K found in the course of carrying out step 116. Having executed the algorithm, computer 22 of FIG. 1 supplies that value of K to the timing signal generator 16 of FIG. 1.

Figure 10:
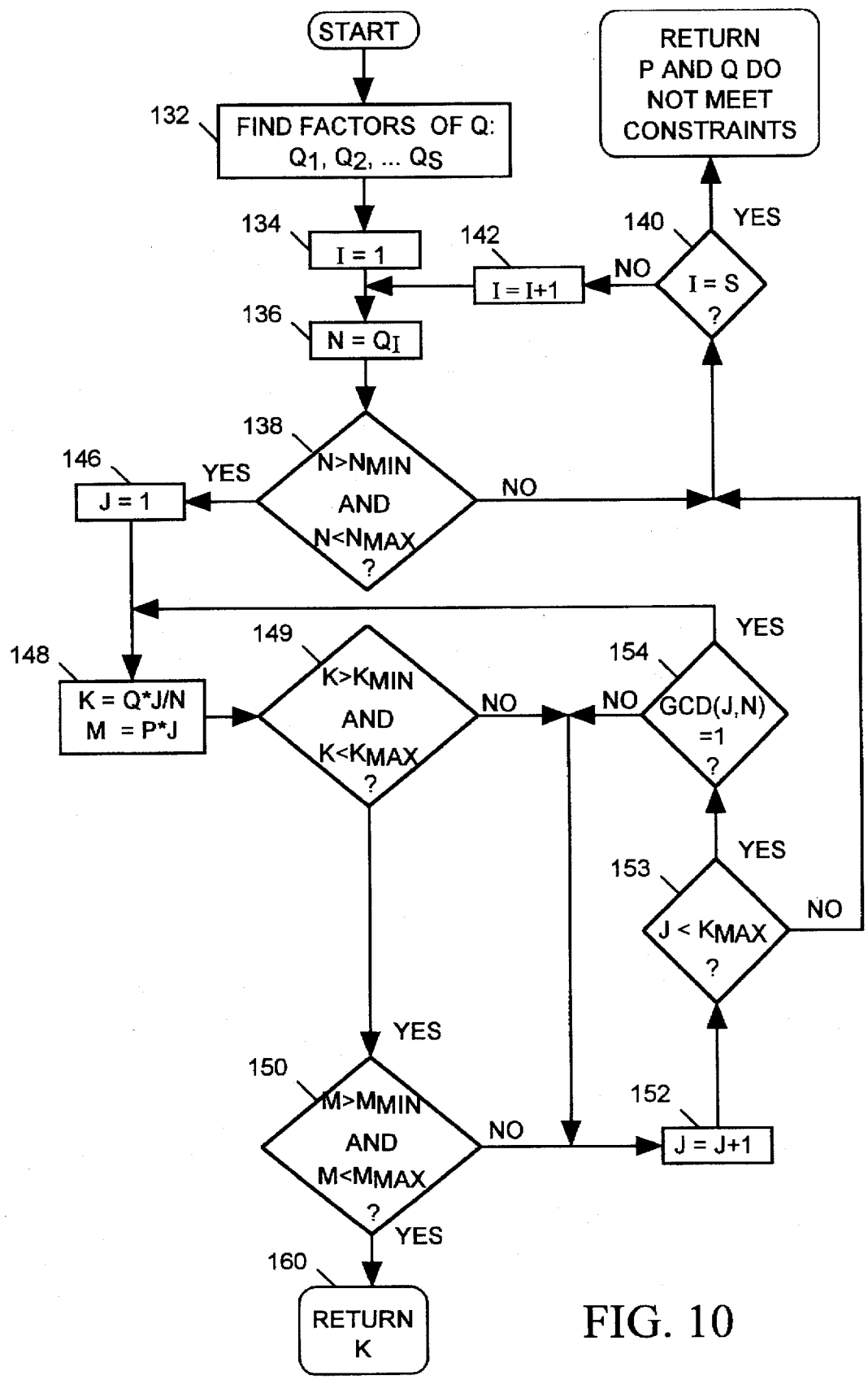
FIG. 10 is a flow chart illustrating the P and Q constraint test step of FIG. 9 in more detail.

FIG. 10 is a flow chart illustrating the P and Q criteria test step 116 of FIG. 9 in more detail. Beginning at step 132, the computer generates the set of all S integer factors $\{Q_1, Q_2 \ldots Q_s\}$ dividing evenly into Q using any of several well-known factoring algorithms. Setting a counter I equal to 1 (step 134) the routine chooses the first factor ($Q_I=Q_1$) as a first candidate for the value of N (step 136). The routine then tests the value of N to determine if it falls within its minimum and maximum constraints (step 138). If N fails the test of step 138, I is tested as to whether it is equal to S (step 140). If I is less than S, the routine increments I by one (step 142) and chooses a next factor of Q ($Q_I=Q_2$) as a next candidate for N (step 136). The new value of N is then tested against the minimum and maximum limits for N (step 138). The routine continues to circulate through steps 136–142 successively looking at each factor of Q ($Q_1 \ldots Q_s$) until it finds one that meets the criteria for N. If none of factors ($Q_1 \ldots Q_s$) of Q lie within the bounds of $N_{MIN}$ and $N_{MAX}$, then at some point I will equal S at step 140. In such case the routine ends returning the result that candidate values for P and Q do not meet constraints. Thus the computer returns to step 118 of FIG. 9 to look for a next best P/Q fit to the TARGET.

However when a candidate for N passes the criteria for N at step 138, the routine sets a counter J to 1 (step 146) and computes candidate values for K and M (step 148). K is set equal to Q*J/N and M is set equal to P*J so as to satisfy equations (10) and (11) above. The routine then tests K and M to determine if K lies between $K_{MIN}$ and $K_{MAX}$ (step 149), and to determine if M lies between $M_{MIN}$ and $M_{MAX}$ (step 150). If the value of K or M fails any test at step 149–151, the routine increments J by one (step 152) and then tests J to determine if it is less than $K_{MAX}$ (step 153) and to determine if J and N are relatively prime (step 154). If J is too large at step 153, the routine returns to steps 140, 142 to select a next I. If J and N are not relatively prime at step 154, the routine returns to step 152 to select a next J. If J passes the tests of steps 153 and 154, the routine returns to steps 148–151 to compute and test new candidates for K and M. When values of K and M are found satisfying the tests of steps 149–150, the routine returns the last computed candidate for K (step 160).

Figure 11:
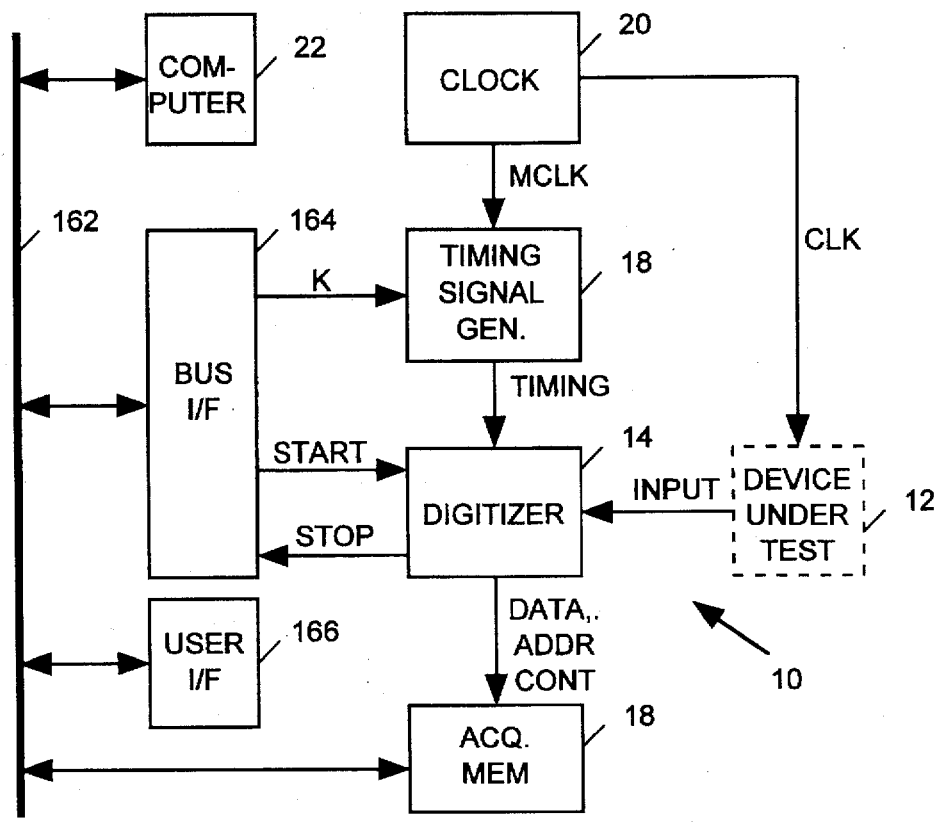
FIG. 11 is a block diagram of the digitizing system of FIG. 1.

FIG. 11 is a block diagram of the digitizing system of FIG. 1. Digitizing system 10 incudes computer 22 connected through a conventional computer bus 162 to acquisition memory 18 a bus interface circuit 164, and user interface hardware 166. The user interface hardware 166 allows a user to provide constraint data input to computer 22. Bus interface circuit 164 includes an addressable internal register for storing the value of K. Computer 22 writes the computed value of K to that register via bus 162. Timing signal generator 18 monitors the value of K stored in interface circuit 164 and adjusts the frequency of its TIMING signal output by frequency dividing the master clock signal MCLK produced by clock circuit 20. When the computer 22 transmits a start command to bus interface circuit 164, the bus interface circuit sends a START signal pulse to digitizer 14. Digitizer 14 then begins digitizing the INPUT signal produced by device under test 12 at a rate determined by the TIMING signal frequency and storing the resulting data sequence in successive memory locations of acquisition memory 18. When digitizer 14 has filled acquisition memory 18 it transmits a STOP signal to computer 22 via bus interface circuit 164. With K adjusted as described above, data stored at any N consecutive addresses in memory 18 will represent one cycle of the INPUT signal. Thus a user may, for example, program computer 22 to respond to the STOP signal by performing DSP analysis on a resulting portion of the data stored at any N successive addresses within acquisition memory 18.

Figure 12:
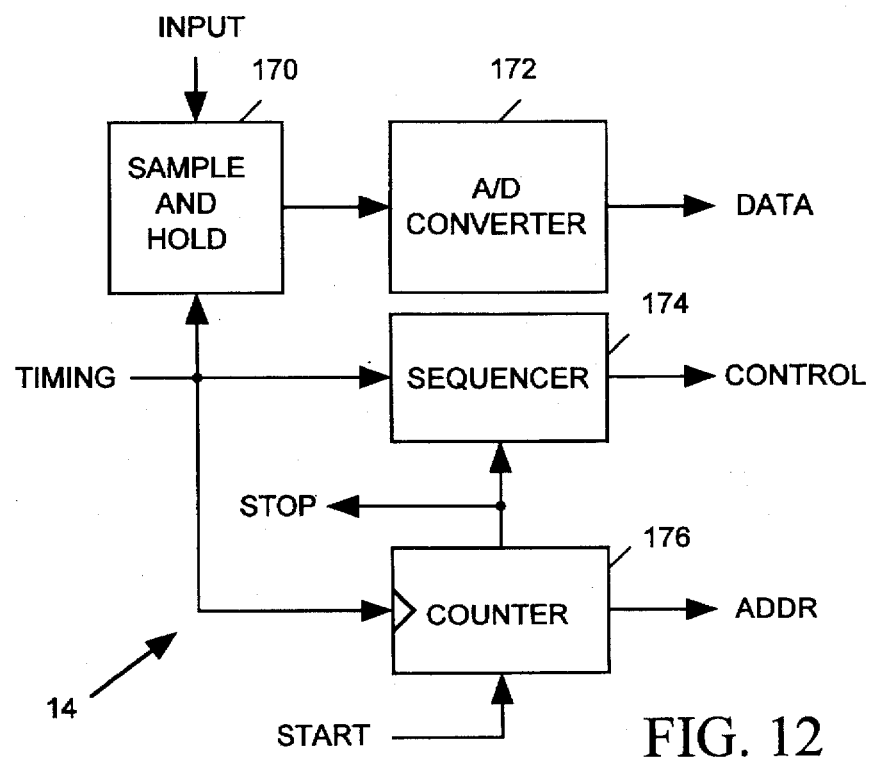
FIG. 12 is a block diagram depicting digitizer 14 of FIG. 1 in more detail.

FIG. 12 is a block diagram depicting digitizer 14 of FIG. 1 in more detail. A sample and hold circuit 170 samples the voltage of the INPUT signal on each rising (or falling) edge of the TIMING signal by charging an internal capacitor to the level of the INPUT signal. An A/D converter 172 monitors the sample voltage produces an output DATA value representing that voltage. value/ A sequencer 174 pulses a CONTROL signal a short time after sample and hold circuit 170 samples the INPUT signal, when A/D converter 172 has had time to generate its DATA output. The CONTROL signal tells acquisition memory 18 of FIG. 11 to store the DATA value. Each timing signal pulse clocks a counter 174 which produces the current write address (ADDR) for memory 18 of FIG. 11. The START signal resets counter 176 and allows it to begin counting pulses. When counter 176 reaches a predetermined limit (less than or equal to the number of addresses in the acquisition memory) it stops counting and asserts the STOP signal transmitted to bus interface circuit 164 of FIG. 22. The STOP signal also disables sequencer 174 until counter 176 is reset so that sequencer 174 stops pulsing the CONTROL signal. Thus no more data is written to acquisition memory 18 until a START signal pulse resets counter 176.

Thus has been shown and described a digitizing system which automatically adjusts the frequency of the TIMING signal controlling sampling rate to provide for coherent sampling taking into account the frequency of the INPUT signal and constraints on the range of K, number of samples to be acquired and number of cycles of the INPUT signal to be sampled. When using coherent sampling, though system 10 may digitize the INPUT signal at a relatively slow rate, the DATA sequence produced is substantially identical to a sequence produced by digitizing the INPUT signal at a much higher rate.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for sampling an input signal of frequency $F_s$, the apparatus comprising:

means for generating a master clock signal of frequency $F_{MCLK}$, that is other than an integer multiple of $F_s$;

first means receiving the master clock signal for sampling the input signal N times during M consecutive cycles of the input signal at a rate $F_s=F_{MCLK}/K$, where M and N are integers greater than one; and second means for finding and supplying to said first means an appropriate integer value for K for which said first means most nearly approximates coherent sampling of the input signal.

2. The apparatus in accordance with claim 1 wherein said second means finds said appropriate value of K by performing a search of a Farey series to locate a particular Farey series term of the form P/Q most closely approximating $F_s/F_{MCLK}$ for which computed values of at least one of K, M and N fall within a predetermined range, wherein $K=J*Q/Q_i$, $M=P*J$ and $N=Q_i$, wherein P and Q are relatively prime integers, $Q_i$ is any integer factor of Q, and J and N are relatively prime integers.

3. The apparatus in accordance with claim 2 wherein said search includes a mediant traversal search of said Farey series directed toward $F_s/F_{MCLK}$.

4. The apparatus in accordance with claim 2 wherein said second means finds the appropriate value of K by performing a search of a Farey series to locate a particular Farey series term of the form P/Q most closely approximating $F_s/F_{MCLK}$ for which K, M and N all fall within predetermined ranges.

5. An apparatus for digitizing an input signal of frequency $F_s$, the apparatus comprising:

means for generating a master clock signal of frequency $F_{MCLK}$, that is other than an integer multiple of $F_s$;

first means receiving the master clock signal for sampling the input signal N times during M consecutive cycles of the input signal at a rate $F_{MCLK}/K$, where M and N are integers greater than one and for digitizing each sample to produce an N-term output data sequence; and second means for finding and supplying to said first means an appropriate integer value for K for which the N-term data sequence produced by said first means has a data content most nearly approximates input signal magnitudes at times evenly distributed over one cycle of the input signal.

6. The apparatus in accordance with claim 5 wherein said second means finds the appropriate value of K by performing a search of a Farey series to locate a particular Farey series term of the form P/Q most closely approximating $F_s/F_{MCLK}$ for which computed values of at least one of K, M and N fall within a predetermined range, wherein $K=Q*J/Q_i$, $M=P*J$ and $N=Q_i$, wherein P and Q are relatively prime, J is any integer greater than 0, $Q_i$ is any integer factor of Q, and J and N are relatively prime.

7. The apparatus in accordance with claim 6 wherein said search includes a mediant traversal search of said Farey series directed toward $F_s/F_{MCLK}$.

8. The apparatus in accordance with claim 6 wherein said second means finds the appropriate value of K by performing a search of a Farey series to locate a particular Farey series term of the form P/Q most closely approximating $F_s/F_{MCLK}$ for which K, M and N all fall within predetermined ranges.

9. A method for periodically sampling an input signal of frequency $F_s$ in response to an input clock signal of frequency $F_{MCLK}$, the method comprising the steps of:

(a) searching a Farey series of limited order to find and select a Farey series number P/Q within said Farey series approximating $F_s/F_{MCLK}$, where P and Q are relatively prime integers;

(b) computing an integer factor $Q_i$ of Q;

(c) frequency dividing the input clock signal by an integer $K=Q*J/Q_i$, where J is an integer greater than 0, to produce a periodic timing signal; and (d) successively sampling said input signal at a rate controlled by said timing signal.

10. The method in accordance with claim 9 wherein step (a) comprises the substeps of:

performing a mediant traversal search of the Farey series to find two adjacent numbers of the Farey series bounding $F_s/F_s$, and selecting as the ratio P/Q one of said two adjacent numbers.

11. The method in accordance with claim 9 wherein step (a) comprises the substeps of:

performing a mediant traversal search of the Farey series to find two adjacent numbers of the Farey series bounding $F_s/F_s$;

performing a horizontal traversal search of Farey series numbers progressively larger and smaller than said two adjacent numbers until encountering a particular Farey series number for which at least one of integers P, Q and K lies within a predetermined limited range; and selecting the particular Farey series number as the number P/Q.

12. A method for digitizing an input signal of frequency $F_s$ in response to an input clock signal of frequency $F_{MCLK}$, the method comprising the steps of:

(a) searching a Farey series of limited order to find and select a Farey series number P/Q within said Farey series approximating $F_s/F_{MCLK}$, where P and Q are relatively prime integers;

(b) computing an integer factor $Q_i$ of Q;

(c) frequency dividing the input clock signal by an integer $K=Q*J/Q_i$, where J is an integer greater than 0, to produce a periodic timing signal; and (d) digitizing said input signal at a rate controlled by said timing signal.

* * * * *